US008149378B2

(12) United States Patent
Morishima et al.

(10) Patent No.: US 8,149,378 B2
(45) Date of Patent: Apr. 3, 2012

(54) CLEANING APPARATUS FOR EXPOSURE APPARATUS AND EXPOSURE APPARATUS

(75) Inventors: Hideki Morishima, Utsunomiya (JP); Takahiro Sasaki, Hiroshima (JP); Hiromitsu Takase, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 584 days.

(21) Appl. No.: 12/108,049

(22) Filed: Apr. 23, 2008

(65) Prior Publication Data

US 2008/0267815 A1    Oct. 30, 2008

(30) Foreign Application Priority Data

Apr. 27, 2007   (JP) ................. 2007-120291

(51) Int. Cl.
*G03B 27/52* (2006.01)
*G03B 27/54* (2006.01)
*G03B 27/42* (2006.01)
*G03B 27/32* (2006.01)

(52) U.S. Cl. ............... 355/30; 355/53; 355/55; 355/67; 355/77

(58) Field of Classification Search .............. 355/30, 355/52, 53, 55, 67–71, 77; 250/492.1, 492.2, 250/492.22, 493.1; 430/5, 8, 30, 311, 312; 422/22–24
See application file for complete search history.

(56) References Cited

U.S. PATENT DOCUMENTS

| 6,268,904 | B1 * | 7/2001 | Mori et al. ............... 355/53 |
| 6,385,290 | B1 | 5/2002 | Kondo et al. |
| 6,459,472 | B1 * | 10/2002 | De Jager et al. ............... 355/68 |
| 6,492,649 | B1 * | 12/2002 | Nei et al. ............... 250/548 |
| 6,504,903 | B1 | 1/2003 | Kondo et al. |
| 6,724,460 | B2 | 4/2004 | Van Schaik et al. |
| 6,813,004 | B1 * | 11/2004 | Horikoshi et al. ............... 355/69 |
| 6,828,569 | B2 | 12/2004 | Van Schaik et al. |
| 6,936,825 | B2 * | 8/2005 | Gerhard et al. ............... 250/431 |

(Continued)

FOREIGN PATENT DOCUMENTS

EP          1009020 B1    4/2007

(Continued)

OTHER PUBLICATIONS

Nicon Corporation, May 2011 English language abstract of Korean Intellectual Property Office Patent Publication (Registration No. 10-0564437 having a publication date of Mar. 29, 2006) entitled Projection Aligner, Projection Exposure Method, Optical Cleaning Method and Method of Fabricating Semiconductor Device, May 2011, where Korean language document Registration No. 10-0564437 having a publication date of Mar. 29, 2006.

*Primary Examiner* — Peter B Kim
*Assistant Examiner* — Christina Riddle
(74) *Attorney, Agent, or Firm* — Canon USA, Inc., I.P. Division

(57) ABSTRACT

A cleaning apparatus for an exposure apparatus that projects a pattern of an exposing mask onto a substrate with first light through an optical element is provided. The cleaning apparatus cleans the optical element with second light having a wavelength different from that of the first light, and includes a recording part configured to record information on exposure history of the exposure apparatus, and an information producing part configured to produce information on a cumulative irradiation light amount of the second light at each of regions in a predetermined cleaning area on the optical element, based on the information on the exposure history.

15 Claims, 9 Drawing Sheets

U.S. PATENT DOCUMENTS

| | | |
|---|---|---|
| 6,989,544 B2 * | 1/2006 | Van Der Veen ............ 250/492.2 |
| 7,115,886 B2 | 10/2006 | Van Schaik et al. |
| 2001/0026354 A1 * | 10/2001 | Aoki ................................ 355/30 |
| 2002/0080338 A1 * | 6/2002 | Taniguchi ........................ 355/67 |
| 2002/0109826 A1 * | 8/2002 | Akagawa et al. ............... 355/53 |
| 2002/0134947 A1 * | 9/2002 | Van Schaik ................ 250/492.1 |
| 2003/0096193 A1 * | 5/2003 | Van Schaik et al. .......... 430/296 |
| 2003/0210458 A1 * | 11/2003 | Luedecke et al. .............. 359/350 |
| 2004/0218157 A1 * | 11/2004 | Bakker et al. ................... 355/30 |
| 2004/0227102 A1 * | 11/2004 | Kurt et al. ................... 250/491.1 |
| 2005/0041226 A1 * | 2/2005 | Tanaka et al. ................... 355/53 |
| 2005/0057734 A1 | 3/2005 | Johannes Stevens et al. |
| 2005/0104015 A1 * | 5/2005 | Wedowski et al. ........ 250/504 R |
| 2005/0178979 A1 * | 8/2005 | Masaki et al. ............. 250/492.1 |
| 2006/0066824 A1 * | 3/2006 | Knappe et al. ................... 355/30 |
| 2006/0176463 A1 * | 8/2006 | Kroon et al. ..................... 355/71 |
| 2006/0207629 A1 * | 9/2006 | Rastegar et al. .................. 134/1 |
| 2007/0138414 A1 * | 6/2007 | Stevens et al. ............ 250/504 R |
| 2008/0001101 A1 * | 1/2008 | Wilhelmus Van Herpen et al. ......................... 250/492.2 |
| 2008/0083878 A1 * | 4/2008 | Ehm et al. ..................... 250/372 |

FOREIGN PATENT DOCUMENTS

| | | |
|---|---|---|
| JP | 2000-088999 A | 3/2000 |
| JP | 2003-188096 A | 7/2003 |
| JP | 2003-234287 A | 8/2003 |
| JP | 2004-207730 | 7/2004 |
| JP | 2005-244015 A | 9/2005 |

* cited by examiner

CLEANING APPARATUS FOR EXPOSURE APPARATUS AND EXPOSURE APPARATUS

BACKGROUND OF THE INVENTION

The present invention relates to an exposure apparatus configured to expose a substrate such as a single crystal substrate for a semiconductor wafer and a glass substrate for a liquid crystal display (LCD) using ultra violet rays or extreme ultraviolet (EUV) light. More particularly, it relates to a cleaning apparatus configured to clean off, by using cleaning light, contamination such as carbon attached to optical elements installed in a projection optical system of the exposure apparatus.

In a projection optical system that projects a mask pattern onto a substrate using ultra violet rays or EUV light as exposure light, contamination such as carbon deposits (or accumulate) on optical elements depending on the amount of the exposure light, thereby deteriorating transmittance or reflectance of the optical elements and generating aberrations. Since the deposited contamination deteriorates performance of the exposure apparatus and reduces lifetime of the optical element, it should be eliminated periodically or as necessary.

As for relationships between the amount of the deposited carbon attached to the optical element (mirror) and the amount of the EUV light being irradiated onto the mirror, some research results have been reported. For example, "Modeling carbon contamination of extreme ultraviolet (EUV) optics," SPIE vol. 5374, pp. 675-685, 2004 Jeromy T. Hollenshead et al, reports a result that the deposited carbon amount is proportional to the square root of an illuminance on a mirror surface. The relationships between the deposited carbon amount and the EUV light amount are changed depending on conditions of irradiation and atmosphere.

Further, methods for cleaning an optical element such as a mirror have been disclosed in Japanese Patent Laid-open Nos. 2000-088999, 2003-188096, 2003-234287, and 2005-244015 in which cleaning light having a specific wavelength is irradiated onto deposited contamination mainly including carbon in a gas atmosphere including specific components such as ozone, oxidant, and water.

However, when the cleaning light having the specific wavelength is irradiated onto the optical element in the gas atmosphere as described above, the cleaning light can be excessively irradiated or the cleaning light can be irradiated onto part of the optical element where no contamination is deposited. As a result, a region of the optical element where the cleaning light needs to be irradiated can be oxidized, whereby optical performance of the optical element may be deteriorated.

To address the problem described above, by actually researching a deposition state of the contamination on the optical element, a method for determining the cleaning light amount depending on the deposition state is conceivable. However, since the irradiation amount of the exposure light changes depending on regions even in the same optical element, the deposition states also changes. With this reason, it makes troublesome tasks and takes time to actually research the deposition state of the contamination on the optical element at each region thereon.

BRIEF SUMMARY OF THE INVENTION

The present invention proposes a cleaning apparatus configured to irradiate cleaning light of an appropriate light amount onto the optical element without directly researching the deposition state of the contamination on the optical element, and an exposure apparatus including the same.

According to an aspect of the present invention, a cleaning apparatus is provided for an exposure apparatus that projects a pattern of an exposing mask onto a substrate with first light through an optical element. The cleaning apparatus cleans the optical element with second light having a wavelength different from that of the first light, and comprises a recording part configured to record information on exposure history of the exposure apparatus, and an information producing part configured to produce information on a cumulative irradiation light amount of the second light at each of regions in a predetermined cleaning area on the optical element, based on the information on the exposure history.

According to another aspect of the present invention, an exposure apparatus is provided which comprises an exposure system configured to project a pattern of an exposing mask onto a substrate with first light through an optical element, and the abovementioned cleaning apparatus.

According to yet another aspect of the present invention, a method for manufacturing a device is provided which comprises the step of performing cleaning of an optical element included in an exposure apparatus that projects a pattern of an exposing mask onto a substrate with first light through the optical element, the cleaning being performed using information on a cumulative irradiation light amount produced by the cleaning apparatus, the step of exposing the substrate using the exposure apparatus, and the step of developing the exposed substrate.

Other aspects of the present invention will be apparent from the embodiments described below with reference to the drawings.

DETAILED DESCRIPTION OF THE EMBODIMENTS

Exemplary embodiments of the present invention will be described below with reference to the accompanied drawings.

Each embodiment described below can select a suitable relationship between an amount of EUV light and that of deposited carbon in consideration of an actual exposure state.

Embodiment 1

Figure 1:
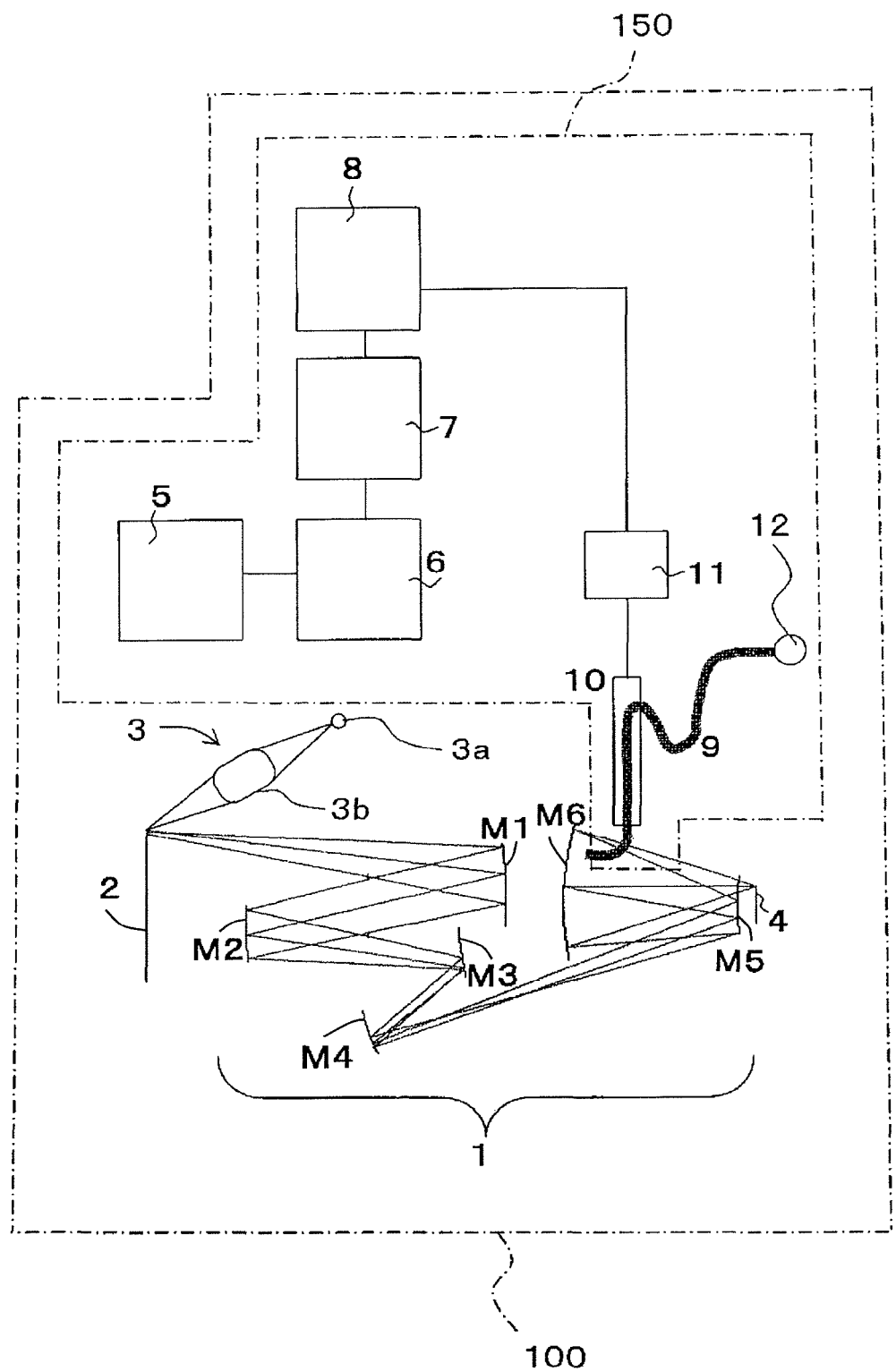
FIG. 1 is a diagram showing the configuration of an exposure apparatus incorporating a cleaning apparatus that is a first embodiment (Embodiment 1) of the present invention.

FIG. 1 shows the configuration of an exposure apparatus including a cleaning apparatus that is a first embodiment (Embodiment 1) of the present invention. The exposure apparatus 100 includes an exposure illumination system 3, a projection optical system 1, a mask stage (not shown), a wafer stage (not shown), and a cleaning apparatus 150. An exposing mask 2 is fixed on the mask stage, and a semiconductor wafer (hereinafter, referred to simply as 'wafer') 4 is fixed on the wafer stage as a substrate. In place of the semiconductor wafer 4, a glass substrate for a liquid crystal display (LCD) may be used as the substrate.

The exposure apparatus 100 includes an exposure mode and a cleaning mode as operation modes, and the modes can be changed automatically or depending on an operation of a mode changing operation part (not shown).

The exposure illumination system 3 includes an exposure light source 3a and an illumination optical system 3b, and irradiates illumination light (exposure light) that is a first light of ultraviolet rays, EUV light and the like onto the exposing mask 2 in the exposure mode. In the description below, the EUV light having a wavelength of approximately 13 nm is used as the illumination light (exposure light).

The projection optical system 1 includes a plurality of reflective optical elements, which are mirrors M1 to M6. The mirrors M1 to M6 sequentially reflect the illumination light (exposure light) that has been reflected or diffracted by the exposing mask 2 to lead it to the wafer 4. With this processing, a reduced image of a pattern of the exposing mask 2 is projected onto the wafer 4, and thereby a pattern of an integrated circuit and the like corresponding to the pattern of the exposing mask 2 is exposed on the wafer 4. Hereunder, exposing the pattern on the wafer 4 is referred to as 'wafer exposure'.

The cleaning apparatus 150 includes an exposure-history recording part 5 as a recording part, an exposure-light-amount analyzing part 6, a deposition-distribution analyzing part 7, a cleaning-light-amount analyzing part 8 as an information producing part, a cleaning light source 12, a cleaning light fiber 9, a fiber actuator 10, and a cleaning controller 11. It should be noted that the cleaning light source 12, the cleaning light fiber 9, the fiber actuator 10, and the cleaning controller 11 may be separated from the cleaning apparatus 150.

Figure 2:
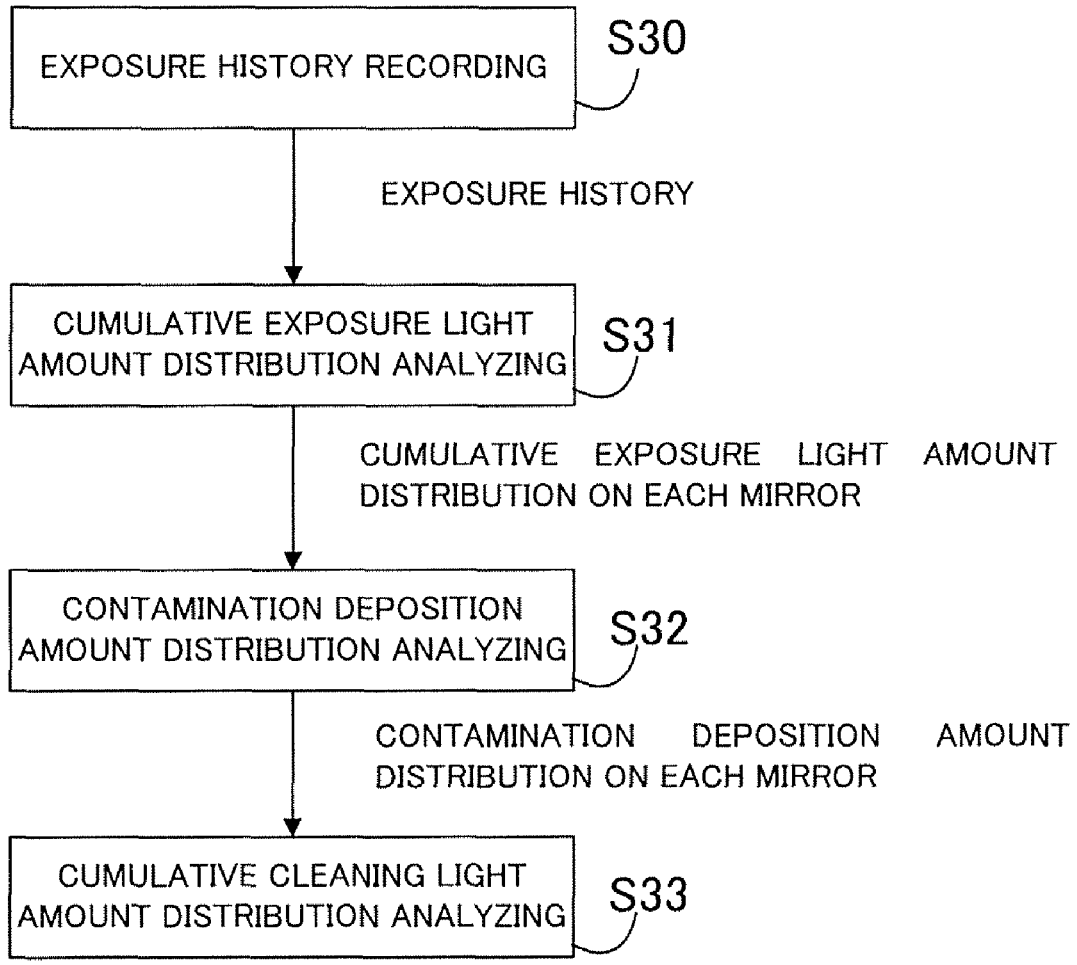
FIG. 2 is a flowchart showing operations of the cleaning apparatus of Embodiment 1.

Hereunder, with reference to a flowchart in FIG. 2, the operations of the cleaning apparatus 150 will be described.

The exposure-history recording part 5 automatically records information on an exposure history (hereinafter, referred to as 'exposure history information') in the exposure mode (step S30 in FIG. 2). The exposure history information records sufficient information for the exposure-light-amount analyzing part 6 and the deposition-distribution analyzing part 7 to calculate a cumulative exposure light amount distribution and a deposition amount distribution of contamination such as carbon attached to each of the mirrors M1 to M6 due to irradiation of the exposure light to the mirrors M1 to M6. Specifically, the exposure history information includes, as information elements, the pattern of the exposing mask 2, irradiation conditions of the exposure light such as the intensity and the amount of the EUV light, and atmosphere of a space including the mirrors M1 to M6 (projection optical system 1).

The atmosphere of the space including the projection optical system 1 is detected through a partial pressure monitor provided in the projection optical system 1, which is an information element necessary for calculating the deposition amount distribution of the contamination (hereinafter, referred to as the contamination deposition amount distribution). The exposure light history information is recorded each time or each series of the wafer exposure.

However, all the above information elements are not necessarily recorded as the exposure history information. If information on a cumulative light amount distribution of the cleaning light that will be described later can be calculated with predetermined accuracy, recording one of the information elements is enough.

For example, when the pattern of the exposing mask 2 and the irradiation conditions of the exposure light are constant, they need not to be recorded. Further, when the partial pressure of the space including the projection optical system 1 is constant, the output of the partial pressure monitor needs not to be recorded.

The exposure-light-amount analyzing part 6 calculates the cumulative light amount distribution of the EUV light (cumulative exposure light amount distribution) on each mirror based on the pattern of the exposing mask 2, the irradiation conditions of the EUV light to be irradiated onto the exposing mask 2, and the like among the elements of the exposure history information (step S31). The cumulative light amount distribution of the EUV light on each mirror corresponds to a time-integral value of the EUV light amount at each region on each mirror. A plurality of 'regions' are set in an area where cleaning is to be performed (a predetermined cleaning area) in the cleaning mode of each mirror. A method for setting the 'regions' is arbitrary, however, the plurality of the same 'regions' are set for the same mirror in the exposure-history recording part 5, the exposure-light-amount analyzing part 6, the deposition-distribution analyzing part 7, and the cleaning-light-amount analyzing part 8.

The deposition-distribution analyzing part 7 calculates the contamination deposition amount distribution on each mirror, which is the deposition amount of the contamination at respective regions on each mirror based on the cumulative light amount distribution of the EUV light calculated by the exposure-light-amount analyzing part 6 and the atmosphere (partial pressure) detected by the partial pressure monitor among the elements of the exposure light history information (step S32).

Ingredients of the deposited contamination vary depending on materials forming the each mirror, materials of members holding or surrounding the projection optical system 1, and the atmosphere described above. In a phase where the wafer exposure is actually performed, experiments and analyses previously performed have already obtained data about what kind of and how much the contamination is attached for the cumulative light amount distribution of the EUV light on each mirror. Accordingly, the deposition-distribution analyzing part 7 can estimate the contamination deposition amount distribution on the each mirror based on the data.

When the deposition amount of the contamination exceeds a permissible value for one of the mirrors, the cleaning controller 11 provides an alarm for prompting cleaning of the mirror or all the mirrors M1 to M6 (that is, switching to the cleaning mode), or automatically changes to the cleaning mode.

In the cleaning mode, the wafer exposure is not performed, but cleaning of each mirror is performed. The cleaning-light-amount analyzing part 8 calculates (generates), based on the contamination deposition amount distribution on the each mirror calculated by the deposition-distribution amount analyzing part 7, information on the cumulative light amount distribution of the cleaning light to be irradiated onto each mirror (step S33). Here, as the information on the cumulative light amount distribution of the cleaning light, the distribution of the cumulative light amount of the cleaning light itself is calculated. The cumulative light amount distribution of the cleaning light corresponds to the cumulative irradiation light amount that is a time-integral value of the cleaning light amount at each region on each mirror. In other words, the information on the cumulative light amount distribution of the cleaning light on each mirror is information of the cumulative irradiation light amount of the cleaning light at each region on each mirror.

Non-EUV light having a wavelength different from that of the EUV light which is the exposure light or ultra violet rays having a wavelength of 172 nm is used as the cleaning light (second light).

The mirror cleaning is performed by irradiation of the cleaning light from the cleaning light source 12 through an end of the cleaning light fiber 9 onto each mirror, while supplying the gas including oxygen, ozone, and water to the space including the projection optical system 1 with an appropriate pressure. The end of the cleaning light fiber 9 is moved (scanned) by the fiber actuator 10 along a surface of each mirror. The cleaning controller 11 causes the end of the cleaning light fiber 9 to move (scan) by controlling intensity of light emitting from the cleaning light source 12 and the operations the fiber actuator 10 such that the cumulative light amount distribution of the cleaning light calculated by the cleaning-light-amount analyzing part 8 is re-created. The end of the cleaning fiber 9 may be moved with respect to each mirror step by step or continuously. When it is moved step by step, the cleaning controller 11 determines, based on the cumulative light amount distribution of the cleaning light, an irradiation time period thereof onto each of the regions. When the end of the cleaning fiber 9 is moved continuously, the cleaning controller 11 determines a moving speed of the end of the cleaning light fiber 9 (that is, an irradiation position of the cleaning light).

The present embodiment describes a case where the light emitting intensity of the cleaning light source 12 and the irradiation time period of the cleaning light or irradiation position moving speed are determined after the cumulative irradiation light amount itself is firstly calculated at each region as the information on the cumulative irradiation light amount of the cleaning light at each region based on the contamination deposition amount distribution on each mirror. However, the light emitting intensity and the irradiation time period or irradiation position moving speed, as the information on the cumulative irradiation light amount, may be calculated directly from the contamination deposition amount distribution and conversion data previously obtained in experiments or the like.

As described above, the present embodiment can estimate the contamination deposition amount at each region on each mirror based on the exposure history and calculate the cumulative irradiation light amount of the cleaning light at each region that is appropriate to eliminate the deposited contamination. Therefore, the deposited contamination can be eliminated while deterioration (oxidizing and the like) of the mirror surface caused by excessive irradiation of the cleaning light is avoided.

Although the cleaning apparatus 150 is incorporated in the exposure apparatus 100 in the present embodiment, the cleaning apparatus may be separated from the exposure apparatus. This can be also applied to other embodiments that will be described later.

Embodiment 2

Next, description will be made of a second embodiment (Embodiment 2) of the present invention. In the present embodiment, whether or not to perform the mirror cleaning is determined based on the optical performance of the projection optical system.

Figure 3:
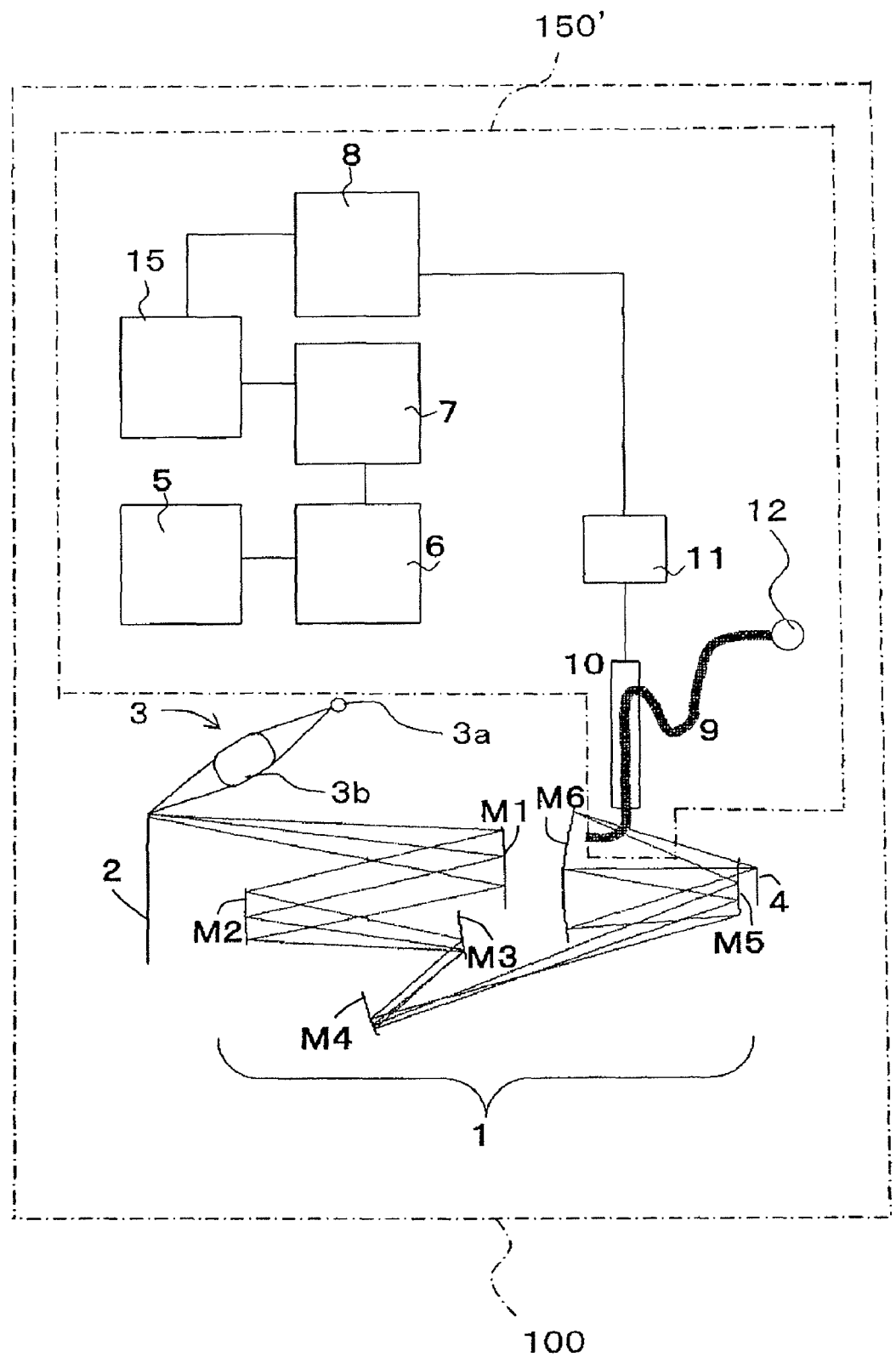
FIG. 3 is a diagram showing the configuration of an exposure apparatus incorporating a cleaning apparatus that is a second embodiment (Embodiment 2) of the present invention.

FIG. 3 shows the configuration of an exposure apparatus including a cleaning apparatus of the present embodiment. In FIG. 3, components identical to those in Embodiment 1 (FIG. 1) are designated with the same reference numerals as those in Embodiment 1, and thus the description thereof are omitted. The cleaning apparatus 150' of the present embodiment is different from the cleaning apparatus 150 in Embodiment 1 in that the cleaning apparatus 150' includes an optical performance analyzing part 15.

Figure 4:
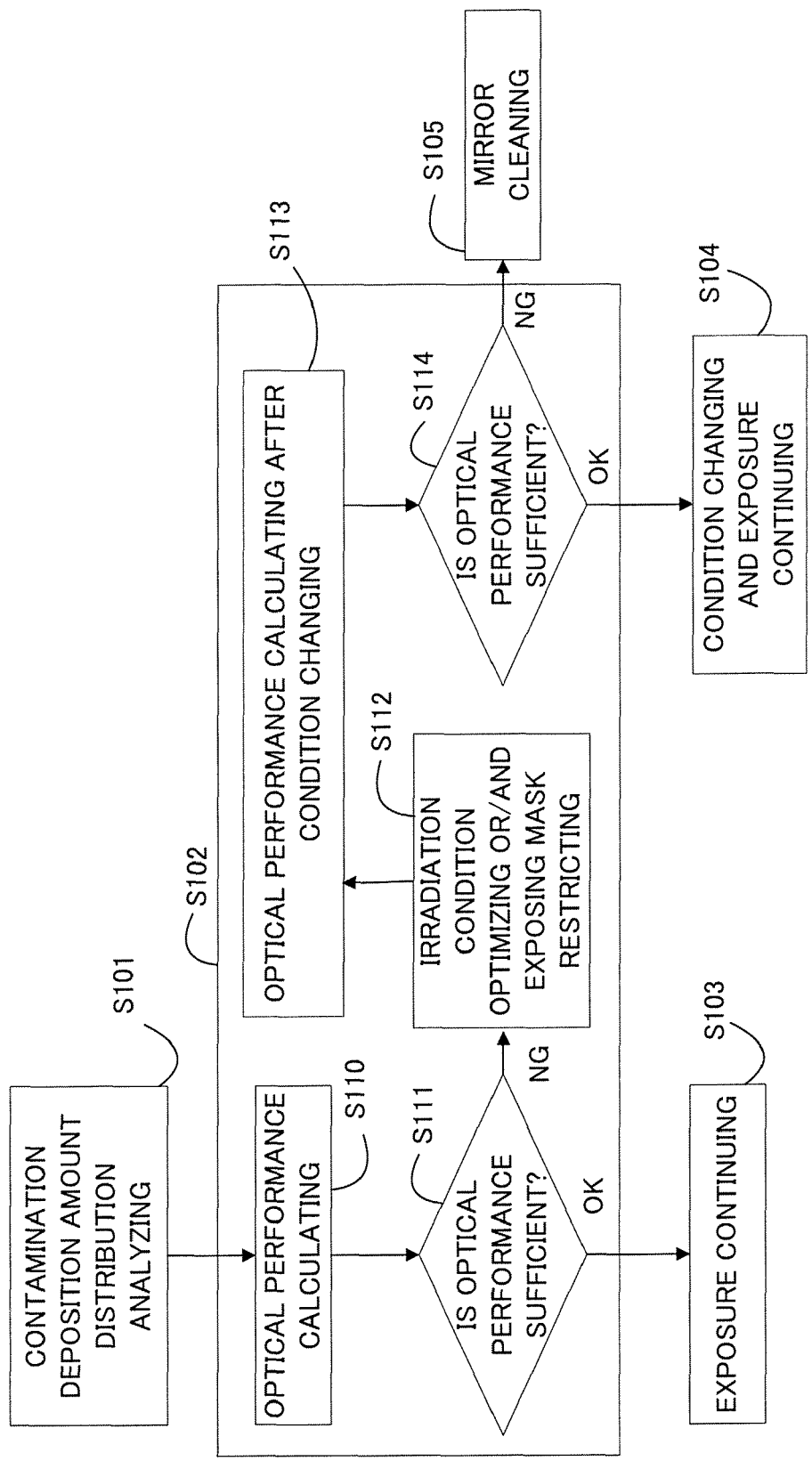
FIG. 4 is a flowchart showing operations of the cleaning apparatus of Embodiment 2.

With reference to FIG. 3 and the flowchart shown in FIG. 4, operations of the cleaning apparatus 150' of the present embodiment will be described.

The operations performed until the deposition distribution analyzing part 7 calculates the contamination deposition amount distribution (step S101 in FIG. 4) are the same as those in Embodiment 1. Although not shown in FIG. 4, the cleaning-light-amount analyzing part 8 calculates (generates) information on the cumulative light amount distribution of the cleaning light to be irradiated onto each mirror based on the contamination deposition amount distribution on each mirror calculated by the deposition-distribution analyzing part 7. The information on the cumulative light amount distribution of the cleaning light is the same as that in Embodiment 1.

The optical performance analyzing part 15 (step S102) calculates the optical performance of the projection optical system 1 from the contamination deposition amount distribution on each mirror (step S110).

More specifically, a pupil distribution and a pupil transmittance distribution of wave aberration for each field angle of the projection optical system 1 are calculated. From these optical characteristics, the pattern of the exposing mask 2 and the irradiation conditions of the exposure light, a pattern image to be formed on the wafer 4 can be calculated.

Further, the optical performance analyzing part 15 determines whether or not parameters such as linewidth error, Line-Edge Roughness (LER) and pattern distortion for a pattern image (calculated value) to be formed on the wafer 4 fall within their permissible ranges (step S111). For some contamination deposition amount distributions, the above described parameters fall within the permissible ranges when a pattern of a certain exposing mask is projected onto the wafer 4, however, the parameters are out of the permissible ranges when a pattern of other exposing masks is projected thereon. Therefore, the determination of whether or not to perform the mirror cleaning may be made based on whether or not the aforementioned parameters fall within the permissible ranges for an exposing mask 2 to be subsequently used in the exposure (immediately after this determination).

When the aforementioned parameters fall within the permissible ranges, it is determined that the wafer exposure is continued, without cleaning the projection optical system 1 (step S103). On the other hand, when the aforementioned parameters do not fall within the permissible ranges, a determination is made so that the irradiation conditions of the exposure light are optimized or a change from the exposing mask currently used to an exposing mask having a different pattern is restricted (step S112).

The optical performance analyzing part 15 calculates the optical performance of the projection optical system 1 for the optimized irradiation conditions of the exposure light and the changed exposing mask, and then determines whether or not the aforementioned parameters fall within the permissible ranges (steps S113 and S114). When the aforementioned parameters fall within the permissible ranges, the wafer exposure is continued using the optimized irradiation conditions or the changed exposing mask (step S104). On the other hand, when the aforementioned parameters do not fall within the permissible ranges, the process proceeds to the cleaning mode to clean each mirror, similarly to Embodiment 1 (step S105).

When the mirror cleaning is performed according to the calculation result of the optical performance of the projection optical system 1, it can be analyzed or determined whether all of the mirrors M1 to M6 need to be cleaned or only part of them needs to be cleaned.

Embodiment 3

The aforementioned Embodiments 1 and 2 described the cases where the respective mirrors are sequentially cleaned using the cleaning light fiber that scans the cleaning light from the cleaning light source on each mirror. However, such a cleaning method will need a long cleaning time to clean all the mirrors. In order to reduce the cleaning time, the embodiment that will be described below can be employed.

Figure 5:
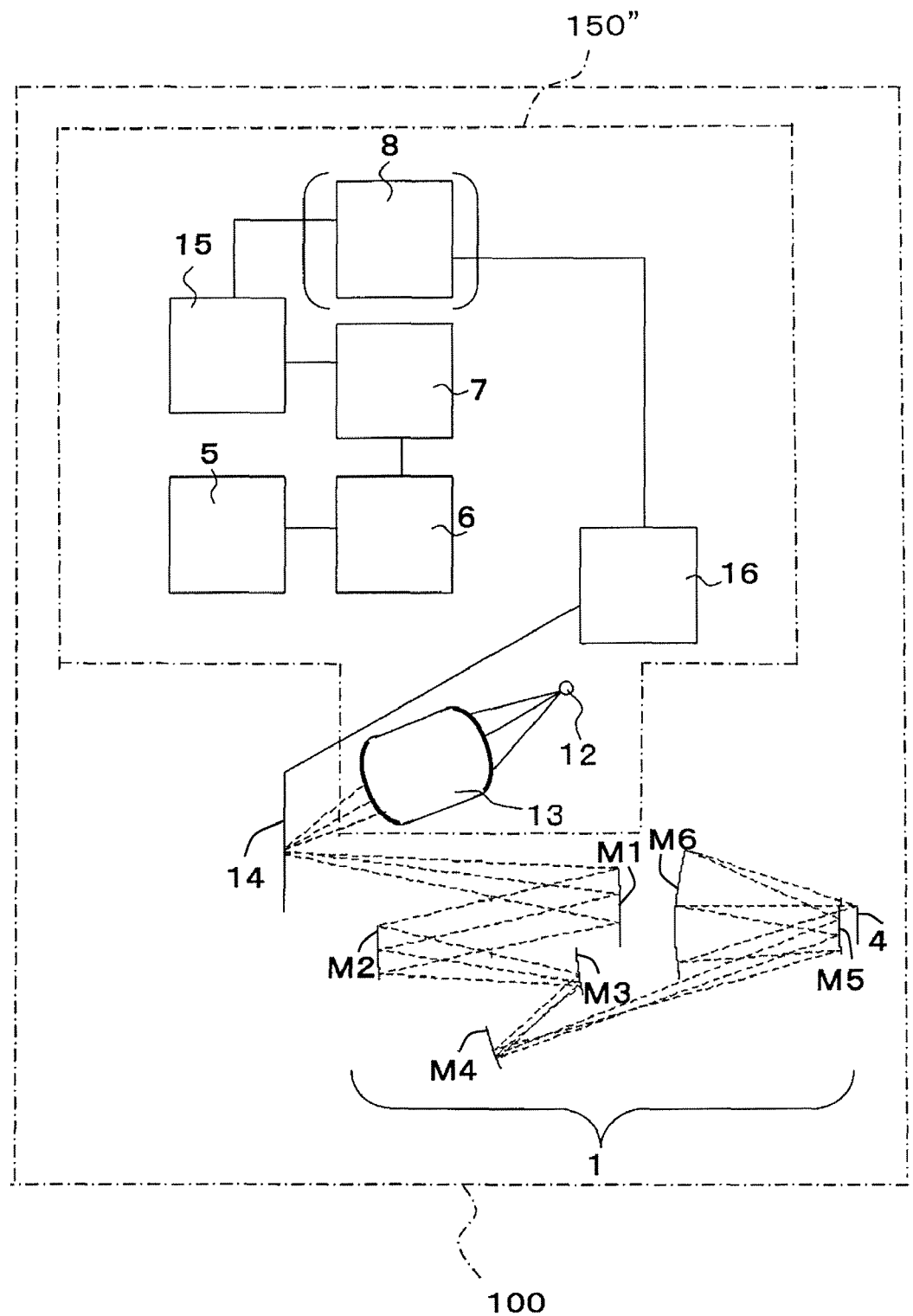
FIG. 5 is a diagram showing the configuration of an exposure apparatus incorporating a cleaning apparatus that is a third embodiment (Embodiment 3) of the present invention.

FIG. 5 shows the configuration of an exposure apparatus including a cleaning apparatus according to Embodiment 3 of the present invention. In FIG. 5, components identical to those in Embodiment 1 (FIG. 1) or Embodiment 2 (FIG. 3) are designated with the same reference numerals as those in Embodiment 1 or 2, and thus the description thereof are omitted.

In the present embodiment, in the cleaning mode, in place of the exposing mask used in the exposure mode, a cleaning mask 14 is provided at a position equivalent to that of the exposure mask. The cleaning light from the cleaning light source 12 of the cleaning apparatus 150" is irradiated onto the cleaning mask 14 through an illumination optical system 13. The cleaning light reflected or diffracted by the cleaning mask 14 is sequentially reflected on the mirrors M1 to M6, similarly to the exposure light.

The cleaning light source 12 and the illumination optical system 13 may be provided in an apparatus separated from the cleaning apparatus.

Further, the cleaning apparatus 150" in the present embodiment includes a cleaning-mask-pattern analyzing part 16, in place of the cleaning controller 11 of Embodiments 1 and 2. The cleaning-mask-pattern analyzing part 16 determines the shape or pattern of the cleaning mask 14 based on the information on the cumulative light amount distribution of the cleaning light to be irradiated onto each mirror calculated by the cleaning-light-amount-analyzing part 8 (herein, based on the information on the cumulative light amount distribution itself). The shape or pattern of the cleaning mask 14 is determined so that a cumulative light amount distribution of the cleaning light that is similar to the cumulative exposure light amount distribution on each mirror calculated by the exposure-light-amount analyzing part 6 can be obtained on each mirror.

A method for determining a specific shape or pattern (hereinafter, collectively referred to as a pattern) of the cleaning mask 14 will be described.

The cumulative light amount distribution of the cleaning light is originally determined so as to correspond to the contamination deposition amount distribution on each mirror calculated by the deposition-distribution analyzing part 7, and the contamination deposition amount distribution corresponds to the cumulative exposure light amount of the EUV light on each mirror calculated by the exposure-light-amount analyzing part 6. Therefore, the cumulative light amount distribution of the cleaning light on each mirror corresponds to the cumulative exposure light amount of the EUV light on each mirror.

Since the EUV light and the cleaning light whose wavelength is 172 nm and which is non-EUV light have short wavelengths, impacts of the diffraction by the mirror are small. Therefore, when the EUV light and cleaning light having light amount distributions similar to each other enter the projection optical system 1 through the mirror M1, the light amount distributions of the EUV light on the mirrors M2 to M6 and those of the cleaning light thereon have a similarity relationship because of the difference between the reflectance of the reflective film formed on each mirror for the EUV light and that for the cleaning light, though the illuminance of the EUV light on each mirror and that of the cleaning light thereon are different from each other.

Thus, the pattern of the cleaning mask 14 can be determined by the following method.

(1) The cleaning-mask-pattern analyzing part 16 performs a forward propagation calculation in order of the mirrors of M2, M3, M4, M5, and M6 at the wavelength of the cleaning light, based on the cumulative light amount distribution of the cleaning light on the mirror M1 closest to the cleaning mask 14 which is calculated by the cleaning-light-amount analyzing part 8.

(2) The cumulative light amount distributions of the cleaning light on each of the mirrors M2 to M6 obtained in (1) need to be similar to the cumulative light amount distribution of the cleaning light on each mirror originally calculated by the cleaning-light-amount analyzing part 8. Thus, a phase distribution is provided which is most optimal to the cumulative light amount distribution of the cleaning light on the mirror M1 that is used as a reference for the forward propagation calculation. The phase distribution can be calculated by optimization using a damped least square (DLS) method.

(3) Next, a backward propagation calculation using the cumulative light amount distribution of the cleaning light on the mirror M1 including the phase distribution is performed from the mirror M1 to the position of the cleaning mask 14, and thereby the pattern of the cleaning mask 14 is calculated.

The cleaning mask 14 having the pattern calculated as described above is placed at the position equivalent to that of the exposing mask, and then the cleaning light is irradiated onto the cleaning mask 14. Thus, the cleaning light reflected or diffracted by the cleaning mask 14 enters the projection optical system 1. The cleaning light entering the projection optical system 1 is irradiated onto each of the mirrors M1 to M6 with cumulative light amount distributions similar to the cumulative light amount distribution of the cleaning light on each mirror calculated by the cleaning-light-amount analyzing part 8.

As described above, the reflectance of each mirror for the EUV light is different from that for the cleaning light formed of the ultra violet rays having a wavelength of 172 nm. A multilayer film optimized for the EUV light has a reflectance of approximately 67 percent for the EUV light. However, for the cleaning light (172 nm), it has a reflectance of approximately ½ to ⅓ of that for the EUV light.

When a necessary irradiation amount of the cleaning light is irradiated onto the mirror M1, a predetermined cumulative light amount distribution of the cleaning light is realized for the mirror M1, thereby sufficiently eliminating the deposited contamination. On the mirrors M2 to M6, although the cumulative light amount distributions of the cleaning light on the respective mirrors calculated by the cleaning-light-amount analyzing part 8 are similar to each other, the cleaning light amount thereon is insufficient. Therefore, the mirror cleaning may not be sufficiently performed. Further, when the cumulative light amount distribution of the cleaning light is optimized on any one of the mirrors M2 to M6, the cleaning light is excessively irradiated onto at least one of the other mirrors, thereby generating an oxidized portion thereon.

In these cases also, the optical-performance analyzing part 15 can estimate the contamination deposition amount distribution or an oxidized amount distribution after the mirror cleaning as the optical performance of the projection optical system 1 after the mirror cleaning. Therefore, when the pattern of the exposing mask 2 is to be exposed on the wafer, the cumulative light amount distribution of the cleaning light on each mirror can be optimized for the pattern of the exposing mask 2.

In the present embodiment, the pattern of the cleaning mask 14 is determined by the cleaning-mask-pattern analyzing part 16 on the basis of the cumulative light amount distribution of the cleaning light to be irradiated onto each mirror calculated by the cleaning-light-amount analyzing part 8. However, the following configuration can be employed as an alternative embodiment of the present invention.

That is, the cleaning-mask-pattern analyzing part 16 may calculate (generate) the pattern (or the shape) of the cleaning mask 14 as one of the information on the cumulative light amount distribution (cumulative irradiation light amount at each region) of the cleaning light, based on the deposition amount distribution calculated by the deposition-distribution analyzing part 7.

According to the present embodiment, the cleaning light from the cleaning light source 12 is irradiated onto the cleaning mask 14, and then the reflected light or the diffracted light generated at the cleaning mask 14 enters the projection optical system 1. With this processing, all the mirrors included in the projection optical system 1 can be cleaned together. Accordingly, compared to Embodiments 1 and 2 in which the mirrors are sequentially cleaned, the cleaning time can be reduced.

Figure 6:
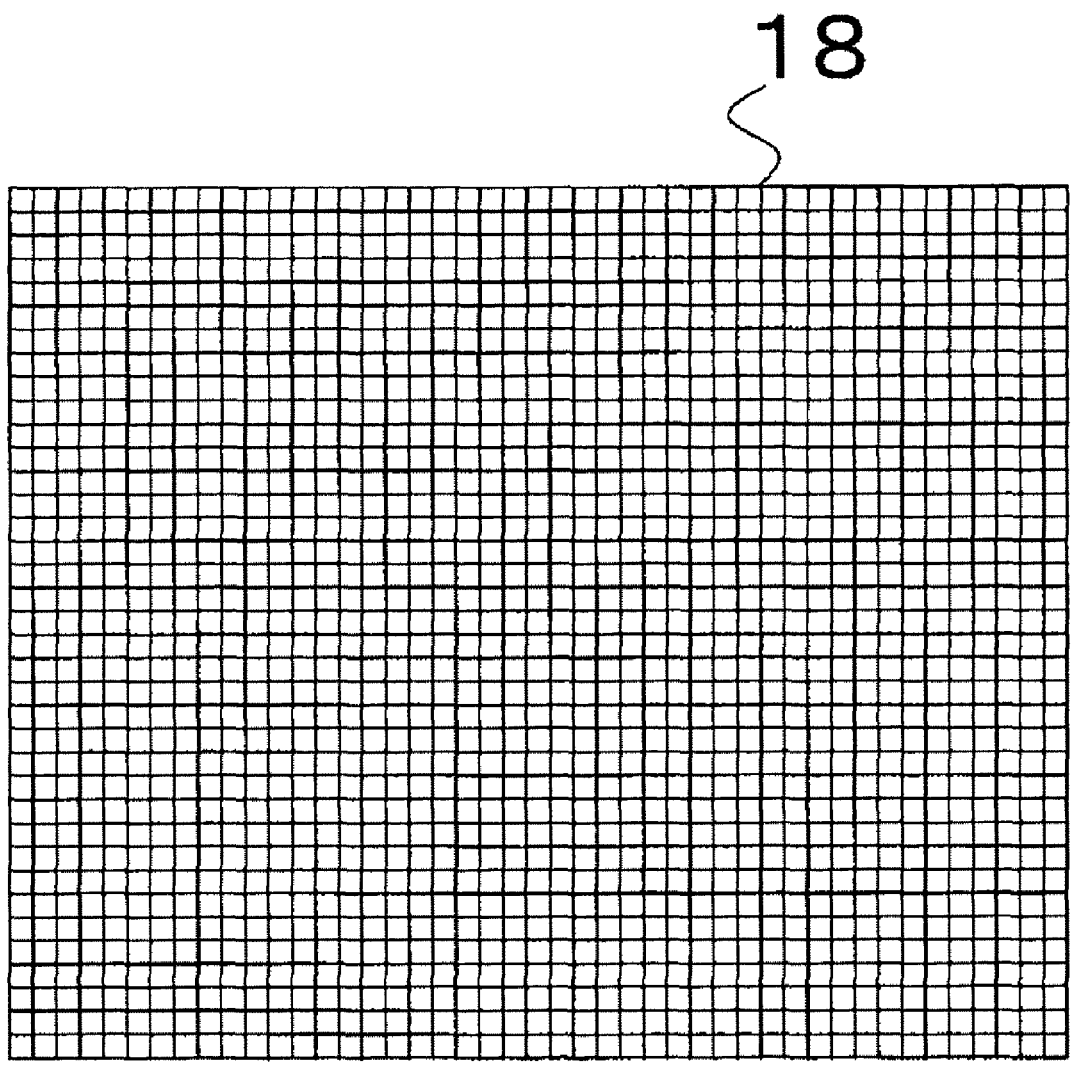
FIG. 6 is a diagram showing another example of a cleaning mask used in Embodiment 3.

In the present embodiment, the case where the cleaning mask 14 on which a fixed reflective pattern is formed is used is described. However, a digital micro mirror device (DMD) 18 shown in FIG. 6 may be used as the cleaning mask. In this case, controlling the directions of a plurality of reflective surfaces (mirrors) included in the DMD 18 can form various kinds of reflection patterns. Thus, the pattern formed by the DMD 18 is determined similarly to the method described above.

Using the DMD 18 as the cleaning mask can omit the necessity of producing cleaning masks dedicated to each exposing mask.

As described above, in each of the aforementioned embodiments, the distributions of the deposited contamination on the mirrors as optical elements in the projection optical system are calculated based on the exposure history, and thereby the cleaning light can be irradiated onto each mirror with an appropriate cumulative light amount distribution according to the contamination deposition amount distribution. Therefore, the cleaning of each mirror can be performed while suppressing the deterioration of the optical performance of the projection optical system.

In other words, in each of the aforementioned embodiments, the information on the exposure history is recorded, and the information on the cumulative irradiation light amount of the cleaning light (second light) is acquired based on that information. With this processing, an appropriate cumulative light amount of the cleaning light can be irradiated onto the optical elements without directly researching the deposition state of the contamination on the optical elements. Thus, the deposited contamination can be eliminated without deteriorating the optical elements.

Embodiment 4

Next, an example of a projection exposure apparatus 200 in which a projection optical system shown in aforementioned Embodiments 1 to 3 is provided will be described with reference to FIG. 7.

The exposure apparatus 200 of this embodiment uses EUV light as illumination light, for example its wavelength is 13.5 nm, to expose onto a substrate 240 as a wafer a circuit pattern formed on an exposing mask 220 by a step-and-scan method, a step-and-repeat method or the like. This exposure apparatus 200 is suitable for lithography processing in a size of smaller than submicron or quarter micron. Hereinafter, this embodiment will describe an exposure apparatus by the step-and-scan method, which is also referred to as a scanner, as an example.

The step-and-scan method is an exposure method in which continuous scanning of a wafer with respect to an exposing mask is performed to expose a pattern formed on the exposing mask onto the wafer, and the wafer is moved to a next exposure position by a step movement after each shot of exposure is completed. The step-and-repeat method is an exposure method in which a wafer is moved by a step movement after every one-shot exposure of the wafer, and then the wafer is moved to a next exposure position.

Figure 7:
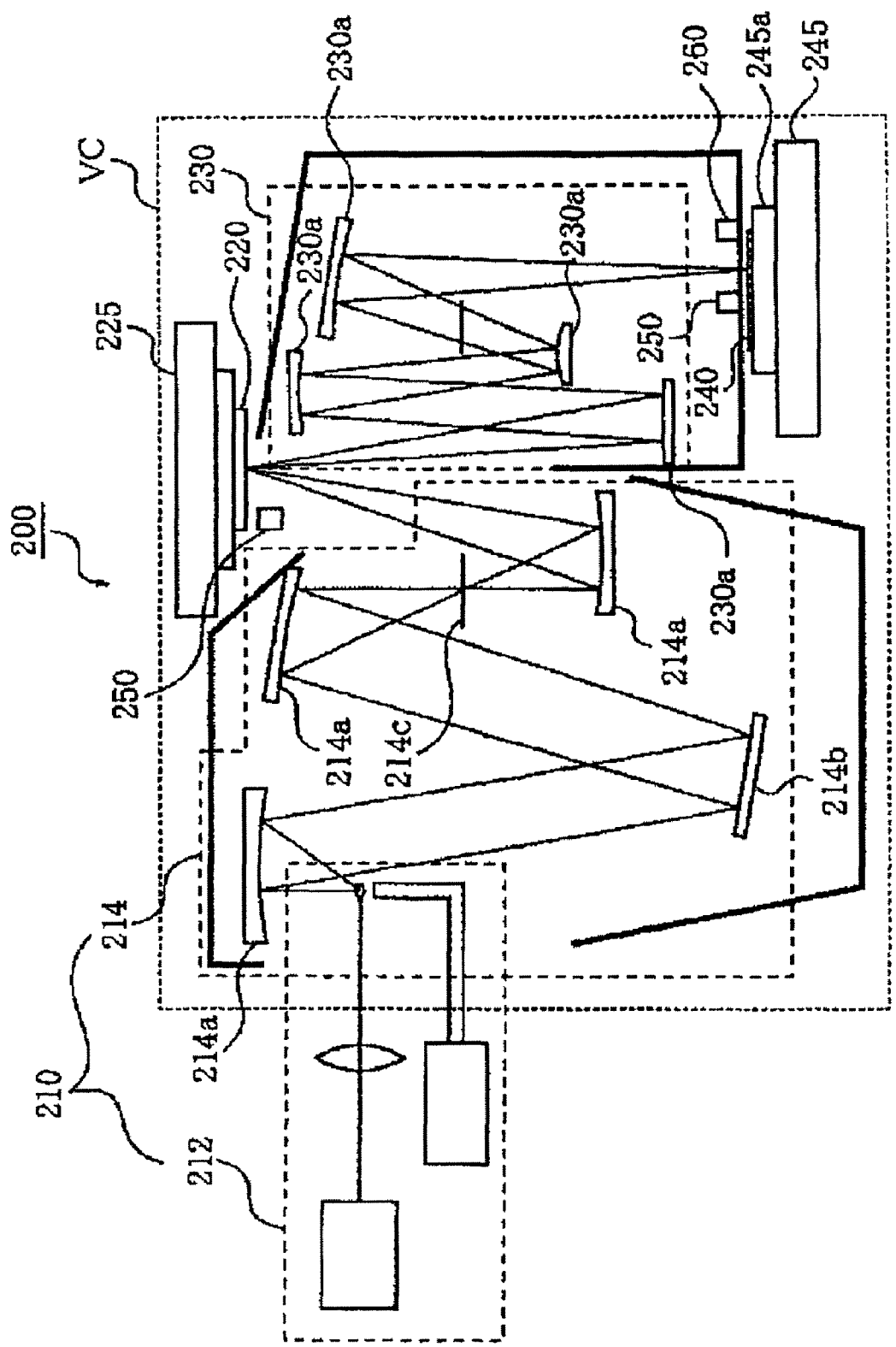
FIG. 7 is a diagram showing an example of the exposure apparatus capable of incorporating the cleaning apparatus of each of Embodiments 1 to 3.

Referring to FIG. 7, the exposure apparatus 200 includes an illumination apparatus 210 for illuminating the exposing mask 220 with light from a light source, a mask stage 225 for mounting the mask 220, and a projection optical system 230 for introducing the light from the exposing mask 220 to the substrate (wafer) 240. It further includes a wafer stage 245 for mounting the substrate 240, an alignment detection mechanism 250, and a focus position detection mechanism 260.

FIG. 7 shows a catoptric reduction projection optical system including four mirrors between the exposing mask 220 at which the light is reflected and the substrate 240 which the light reaches after the reflection to simplify the figure. However, equal to or more than six mirrors are actually provided as shown in Embodiments 1 to 3.

Further, as shown in FIG. 7, the EUV light has low transmissivity with respect to atmosphere, and it generates contamination by reacting to residual gas (polymer organic gas and the like). Thus, at least an inside of a path through which the EUV light passes, that is, an entire optical system is kept in vacuum atmosphere (VC).

The illumination apparatus 210 illuminates the exposing mask 220 with the EUV light, for example its wavelength is 13.4 nm, having an arc shape with respect to a view field having an arc shape of the projection optical system 230, and includes an EUV light source 212 and an illumination optical system 214.

The EUV light source 212 employs, for example, a laser plasma source. In the laser plasma source, a high-intensity pulse laser beam is irradiated onto a target member in a vacuum container to generate high-temperature plasma, which irradiates the EUV light, for example its wavelength is approximately 13 nm. The target member includes a metal layer, gas jet and a liquid drop. In order to improve the average intensity of the irradiated EUV light, higher cyclic frequency of the pulse laser is desirable, so that the EUV light source 212 is normally driven at a cyclic frequency of several kHz.

The illumination optical system 214 is constituted by a condenser (collective) mirror 214a and an optical integrator 214b. The condenser mirror 214a collects the EUV light substantially isotopically irradiated from the laser plasma. The optical integrator 214b illuminates the exposing mask 220 uniformly with a predetermined NA. Further, the illumination optical system 214 is provided with an aperture 214c for restraining an illumination region of the exposing mask 220 into an arc shape at a position conjugate with the exposing mask 220.

There may be provided a cooling apparatus for cooling the condenser mirror 214a and an optical integrator 214b that are optical members constituting the illumination optical system 214. The cooling of the condenser mirror 214a and the optical integrator 214b prevents their deformation caused by thermal expansions, thereby achieving good image-forming performance.

The exposing mask 220 is a reflective mask, and is formed thereon with a circuit pattern (or an image) to be transferred. The exposing mask 220 is supported and driven by the mask stage 225. Diffracted light from the exposing mask 220 is reflected by the projection optical system 230 described in Embodiments 1 to 3 and then is projected onto the substrate 240. The exposing mask 220 and the substrate 240 are disposed in an optically conjugate relationship. Since the exposure apparatus 200 employs the step-and-scan method, it projects a reduced pattern of the exposing mask 220 onto the substrate 240 by scanning the substrate 240 with respect to the exposing mask 220.

The mask stage 225 supports the exposing mask 220 and is connected to a driving mechanism (not shown). The mask stage 225 can employ any kinds of configurations. The driving mechanism is constituted by a linear motor or the like, and can move the exposing mask 220 by driving the mask stage 225 in at least an X-direction. The exposure apparatus 200 relatively scans the exposing mask 220 and the substrate 240 in a state where they are synchronized.

The projection optical system 230 employs a plurality of mirrors 230a formed of a multilayer film to reduce and project the pattern on a surface of the exposing mask 220 onto the substrate 240 that is an image surface. The number of the plurality of mirrors 230a is equal to or more than six as described above. In order to realize a wide exposure region with as small number of mirrors as possible, only a narrow region having an arc shape (field having a ring shape) located away from the optical axis by a certain distance is used to transfer a wide area by simultaneously scanning the exposing mask 220 and the substrate 240.

The mirrors 230a may be cooled to prevent their deformation caused by thermal expansions by a cooling apparatus, thereby achieving good image-forming performance.

Further, by eliminating the deposited contamination on the mirror 230a by the cleaning apparatus 150, 150', and 150" described in the aforementioned Embodiments 1 to 3, a forming image performance with further excellence can be realized.

The substrate 240 refers to the wafer in this embodiment, however, it widely includes a liquid substrate and other kinds of substrates. A photoresist is applied on the substrate 240.

The wafer stage 245 supports the substrate 240 with a wafer chuck 245a. The wafer stage 245 moves the substrate 240 in the X, Y and Z directions, using the linear motor or the like. The exposing mask 220 and the substrate 240 are synchronously scanned. The positions of the mask stage 225 and the wafer stage 245 are monitored by laser interferometers or the like, and both are driven at a certain velocity ratio.

The alignment detection mechanism 250 measures a positional relationship between the exposing mask 220 and an optical axis of the projection optical system 230, and that between the substrate 240 and the optical axis of the projection optical system 230. The positions of and an angle between the mask stage 225 and the wafer stage 245 are set such that the position of a projected image of the exposing mask 220 coincides with a predetermined position on the substrate 240.

The focus position detection mechanism 260 measures a focus position on a surface of the substrate 240, and controls the position and the angle of the wafer stage 245 so as to always maintain the surface of the substrate 240 at a position where the image is formed through the projection optical system 230 during exposure.

During exposure, the EUV light emerging from the illumination apparatus 210 illuminates the exposing mask 220 to form the pattern on the surface of the exposing mask 220 onto a surface of the substrate 240. In this embodiment, the image surface has an arc shape (having a ring shape). The exposing mask 220 and the substrate 240 are relatively scanned at a speed ratio equivalent to a reduction magnification ratio to expose the entire surface of the mask 220.

Figure 8:
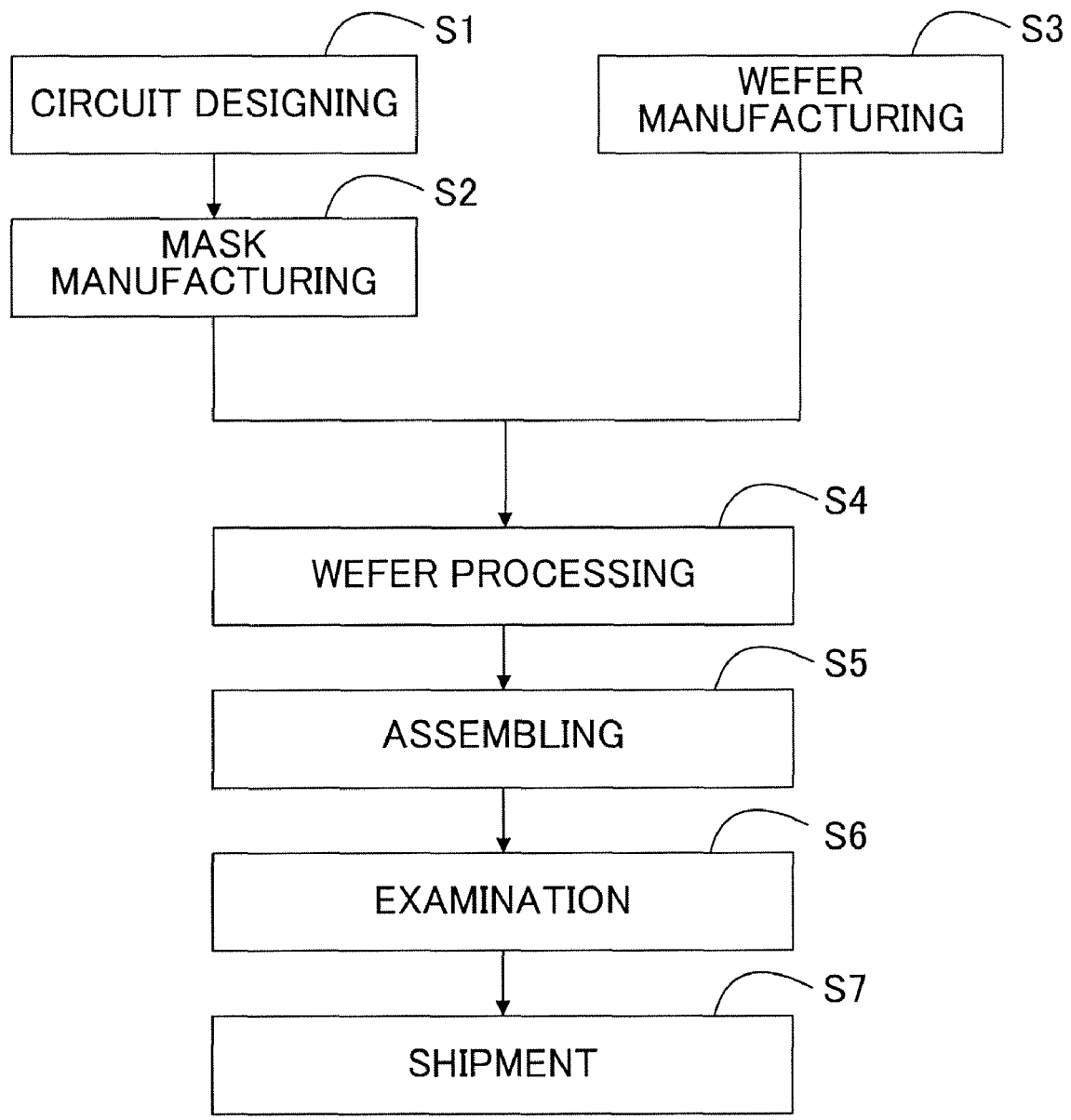
FIG. 8 is a flowchart showing a method for manufacturing a device.

Next, referring to FIGS. 8 and 9, an embodiment of a method for manufacturing devices using the aforementioned exposure apparatus 200 will be described. FIG. 8 shows a flowchart for describing the method for manufacturing devices including LCDs, CCDs, and semiconductor chips such as ICs and LSIs.

This embodiment will describe an example for manufacturing the semiconductor chips.

In step 1 (CIRCUIT DESIGNING), a circuit of a device is designed. In step 2 (MASK MANUFACTURING), an exposing mask on which a pattern of the designed circuit is formed is manufactured.

In step 3 (WAFER MANUFACTURING), a wafer is manufactured using a material such as silicon. In step 4 (WAFER PROCESSING) referred to as a wafer process, in which an actual circuit is formed on the wafer using the exposing mask and the wafer by lithography technology.

In step 5 (ASSEMBLING) and step 6 (EXAMINATION) referred to as an assembly and testing process, in which the wafer manufactured in step 4 is processed into a semiconductor chip and tested. The step 5 includes processes such as an assembly process (dicing, bonding) and a package process (enclosing a chip). In step 6, tests of operation confirmation and durability about the semiconductor device manufactured in step 5 is examined. Through these processes, the semiconductor device is completed and shipped out in step 7 (SHIPMENT).

Figure 9:
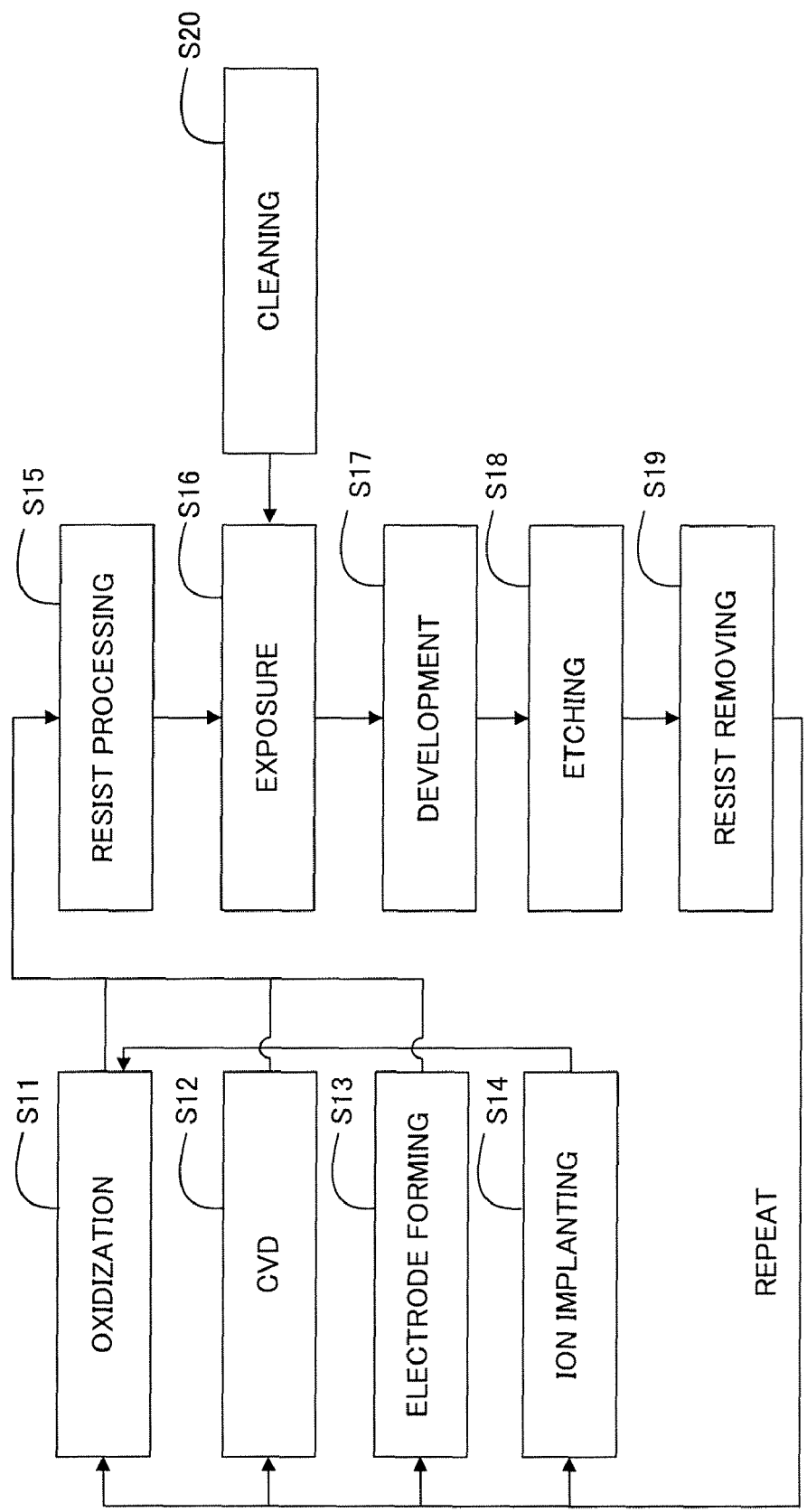
FIG. 9 is a flowchart of a wafer process in detail at step 4 in FIG. 8.

FIG. 9 shows a flowchart in detail for describing the wafer processing in step 4. In step 11 (OXIDIZATION), a surface of the wafer is oxidized. In step 12 (CVD), an insulation layer is formed on the surface of the wafer. In step 13 (ELECTRODE FORMING), electrodes are formed on the wafer by deposition or the like. In step 14 (ION IMPLANTING), ion is implanted into the wafer. In step 15 (RESIST PROCESSING), photosensitizing agent is applied on the wafer. In step 16 (EXPOSURE), the circuit pattern on the mask is exposed onto the wafer by the exposure apparatus 200.

Here, before and after step S16 (EXPOSURE), by using the cleaning apparatus (150, 150' or 150") described in the aforementioned Embodiments 1 to 3 in step S20, the mirror 230a can be cleaned.

In step 17 (DEVELOPMENT), the exposed wafer is developed. In step 18 (ETCHING), a portion other than a developed resist image is removed. In step 19 (RESIST REMOVING), the unnecessary resist after completing etching is removed. Repeating these steps forms the multi-layered circuit pattern on the wafer.

According to the method for manufacturing the device of this embodiment, the device having higher quality than that of conventional ones can be manufactured.

The method for manufacturing the device using the exposure apparatus 200 and also the device itself as a resulted production constitute one aspect of the present invention.

While the present invention has been described with reference to embodiments, it is to be understood that the invention is not limited to the disclosed exemplary embodiments. The scope of the following claims is to be accorded the broadest interpretation so as to encompass all modifications, equivalent structures and functions.

For example, each of the aforementioned embodiments describes the cleaning apparatus for cleaning the mirrors included in the projection optical system of the exposure apparatus. Additionally, other optical elements such as lenses included in a projection optical system can be cleaned using a cleaning apparatus having a similar configuration to that of each of the aforementioned embodiments. Further, each of the aforementioned embodiments describes the cleaning apparatus for cleaning the mirror included in the projection optical system. Additionally, optical elements included in other optical systems such as the illumination optical system can be also cleaned using a cleaning apparatus having a similar configuration to that of each of the aforementioned embodiments.

Furthermore, each of the aforementioned embodiments describes the cleaning apparatus used for the exposure apparatus using the EUV light as the exposure light. Additionally, a cleaning apparatus having a similar configuration to that of each of the aforementioned embodiments can be also used for an exposure apparatus using exposure light other than the EUV light such as ArF excimer laser or F2 laser.

This application claims the benefit of Japanese Patent Application No. 2007-120291, filed on Apr. 27, 2007, which is hereby incorporated by reference herein in its entirety.

What is claimed is:

1. A cleaning apparatus to clean an optical element included in an exposure apparatus, wherein the exposure apparatus is configured to perform a mask pattern exposure process that utilizes the optical element to at least one of reflect and diffract an exposure light having a pattern of an exposing mask onto a substrate and, as a result of the mask pattern exposure process, contamination is left on the optical element, the cleaning apparatus comprising:

an exposure-history recording part configured to record exposure history information, wherein the exposure history information represents a record of exposure light projected onto one or more substrates from a set of substrates;

a setting unit configured to set a plurality of regions in a predetermined cleaning area of the optical element; a cleaning-light-amount analyzing part configured to utilize the exposure history information to calculate information on a cumulative light amount distribution of a cleaning light (CLADcl) to be irradiated onto each region; and a signal generation unit configured to generate a signal configured to cause a cleaning light system to apply the cleaning light to each region to remove contamination from the optical element, wherein the cleaning light includes a wavelength that is different from a wavelength of the exposure light, and wherein the amount of cleaning light irradiated onto each region is a function of the calculated cumulative light amount distribution of the cleaning light (CLADcl) such that each region receives enough cleaning light to remove contamination from a surface of the optical element while avoiding deteriorating that surface through excessive cleaning light and without directly researching a deposition state of contamination on the optical element, wherein the exposure history information includes, as information elements, at least one of (i) a pattern of an exposing mask, (ii) irradiation conditions of the exposure light that include at least one of the intensity of the exposure light and the amount of the exposure light, and (iii) atmosphere of a space bound by a projection optical system that includes the optical element, wherein the atmosphere is represented at least by a partial pressure, and wherein, in a case where the information on a cumulative light amount distribution of the cleaning light is calculated to within predetermined accuracy, the recording part records only one information element.

2. A cleaning apparatus to clean an optical element included in an exposure apparatus, wherein the exposure apparatus is configured to perform a mask pattern exposure process that utilizes the optical element to at least one of reflect and diffract an exposure light having a pattern of an exposing mask onto a substrate and, as a result of the mask pattern exposure process, contamination is left on the optical element, the cleaning apparatus comprising:

an exposure-history recording part configured to record exposure history information, wherein the exposure history information represents a record of exposure light projected onto one or more substrates from a set of substrates;

a setting unit configured to set a plurality of regions in a predetermined cleaning area of the optical element; a cleaning-light-amount analyzing part configured to utilize the exposure history information to calculate information on a cumulative light amount distribution of a cleaning light (CLADcl) to be irradiated onto each region;

a signal generation unit configured to generate a signal configured to cause a cleaning light system to apply the cleaning light to each region to remove contamination from the optical element, wherein the cleaning light includes a wavelength that is different from a wavelength of the exposure light, and wherein the amount of cleaning light irradiated onto each region is a function of the calculated cumulative light amount distribution of the cleaning light (CLADcl) such that each region receives enough cleaning light to remove contamination from a surface of the optical element while avoiding deteriorating that surface through excessive cleaning light and without directly researching a deposition state of contamination on the optical element, wherein the optical element is a plurality of optical elements configured to cooperate sequentially to project a reduced image of the pattern of the exposing mask onto the substrate;

an exposure-light-amount analyzing part coupled to the exposure-history recording part, wherein the exposure-light-amount analyzing part is configured to utilize the pattern of the exposing mask to calculate a cumulative light amount distribution of the exposure light (CLADel) on each optical element; and a deposition-distribution analyzing part coupled between the exposure-light-amount analyzing part and the cleaning-light-amount analyzing part, wherein the deposition-distribution analyzing part is configured to utilize the cumulative light amount distribution of the exposure light (CLADel) to calculate the contamination deposition amount distribution (CDAD) on each optical element, wherein the contamination deposition amount distribution (CDAD) on each optical element represents the amount of contamination deposition at each region on each optical element.

3. The cleaning apparatus of claim 2, wherein the cumulative light amount distribution of the exposure light (CLADel) on each optical element corresponds to a time-integral value of the amount of exposure light at each region on each optical element,
wherein the exposure history information includes, as an information element, atmosphere of a space bound by a projection optical system that includes the optical element, wherein the atmosphere is represented at least by a partial pressure, and
wherein the deposition-distribution analyzing part further is configured to utilize the atmosphere from the exposure history information to calculate the contamination deposition amount distribution (CDAD) on each optical element.

4. The cleaning apparatus of claim 2 wherein, in a case where at least one of experiments and analyses previously performed have already obtained data about what kind of and how much contamination previously was left on the optical element, the deposition-distribution analyzing part is configured to estimate the contamination deposition amount distribution (CDAD) based on the data during a phase where exposure light is in fact being projected onto the substrate.

5. The cleaning apparatus of claim 2, wherein the cleaning-light-amount analyzing part further is configured to utilize the contamination deposition amount distribution (CDAD) on each optical element to calculate the information on the cumulative light amount distribution of the cleaning light (CLADcl) to be irradiated onto each region of each optical element.

6. The cleaning apparatus of claim 5, wherein the cumulative light amount distribution of the cleaning light (CLADcl) on each optical element corresponds to a cumulative irradiation light amount that is a time-integral value of a cleaning light amount at each region on the optical element.

7. The cleaning apparatus of claim 2, wherein the plurality of optical elements is part of a projection optical system, the cleaning apparatus further comprising:
an optical performance analyzing part coupled between the deposition-distribution analyzing part and the cleaning-light-amount analyzing part, wherein the optical performance analyzing part is configured to calculate, from the calculated contamination deposition amount distribution (CDAD) on each optical element, an optical performance of the projection optical system.

8. The cleaning apparatus of claim 7 wherein the optical performance analyzing part calculates the optical performance by calculating a pupil distribution and a pupil transmittance distribution of wave aberration for each field angle of the projection optical system as optical characteristics.

9. The cleaning apparatus of claim 8, wherein, for each exposing mask, the optical performance analyzing part is configured to determine whether the cleaning apparatus is to clean an optical element of the exposure apparatus by (i) utilizing the optical characteristics, the pattern of the exposing mask, and irradiation conditions of the exposure light to calculate a pattern image to be formed on the substrate and (ii) determining, from pattern image parameters of the calculated pattern image, whether the pattern image parameters fall within a predetermined range.

10. The cleaning apparatus of claim 9, wherein the pattern image parameters include at least one of linewidth error, Line-Edge Roughness (LER), and pattern distortion.

11. The cleaning apparatus of claim 9, wherein, in a case where the optical performance analyzing part determines that pattern image parameters falls outside of a predetermined range for an exposing mask, the optical performance analyzing part further is configured to (i) determine optimized irradiation conditions of the exposure light, (ii) utilize the optical characteristics, the pattern of the exposing mask, and the determined optimized irradiation conditions of the exposure light to calculate a new pattern image to be formed on the substrate, and (iii) determine, from new pattern image parameters of the new calculated pattern image, whether the new pattern image parameters fall within a predetermined range, wherein if new pattern image parameters fall outside a predetermined range, then the optical performance analyzing part determines that the cleaning apparatus is to clean an optical element of the exposure apparatus.

12. The cleaning apparatus of claim 2, further comprising:
the cleaning light system, wherein the cleaning light system includes
a cleaning light source that produces the cleaning light,
a cleaning mask having a pattern and positioned to communicate the cleaning light to the plurality of optical elements, and
a cleaning-mask-pattern analyzing part that is configured to determine the pattern of the cleaning mask by utilize one of (i) the cumulative light amount distribution of a cleaning light (CLADcl) to be irradiated onto each region of each optical element and (ii) the contamination deposition amount distribution (CDAD) on each optical element.

13. The cleaning apparatus of claim 12, wherein the cleaning-mask-pattern analyzing part determines the pattern of the cleaning mask by (i) performing a forward propagation calculation downstream of the cleaning mask from an optical element M1 closest to the cleaning mask, (ii) providing a phase distribution to a result of the forward propagation calculation, and then (iii) performing a backward propagation calculation from the optical element M1 upstream to the cleaning mask.

14. The cleaning apparatus of claim 13, wherein the optical performance analyzing part further is configured to estimate the contamination deposition amount distribution (CDAD) after a cleaning of an optical element as the optical performance of the projection optical system after an optical element cleaning.

15. The cleaning apparatus of claim 12, wherein the cleaning mask is a digital micro minor device having a plurality of reflective surfaces, wherein a position of each reflective surface is independently responsive to a signal from the cleaning-mask-pattern analyzing part.

\* \* \* \* \*